United States Patent
Pfahnl et al.

[11] Patent Number: 6,091,062
[45] Date of Patent: Jul. 18, 2000

[54] METHOD AND APPARATUS FOR TEMPERATURE CONTROL OF A SEMICONDUCTOR ELECTRICAL-TEST CONTRACTOR ASSEMBLY

[75] Inventors: Andreas C. Pfahnl, Londonderry, N.H.; John H. Lienhard, V, Lexington, Mass.; Daniel J. Watson, Concord, N.H.

[73] Assignee: Kinetrix, Inc., Bedford, N.H.

[21] Appl. No.: 09/014,214

[22] Filed: Jan. 27, 1998

[51] Int. Cl.⁷ ..................................................... H05B 1/02
[52] U.S. Cl. .......................... 219/497; 219/209; 219/494; 438/715; 324/760
[58] Field of Search .................. 219/121.43, 121.59, 219/209, 210, 497, 494; 324/750–760; 438/715, 660, 663

[56] References Cited

U.S. PATENT DOCUMENTS

| | | | |
|---|---|---|---|
| 3,979,671 | 9/1976 | Meeker et al. | 324/158 F |
| 4,370,011 | 1/1983 | Suzuki et al. | 339/74 R |
| 4,604,572 | 8/1986 | Horiuchi et al. | 324/158 F |
| 4,607,220 | 8/1986 | Hollman | 324/158 F |
| 4,734,872 | 3/1988 | Eager et al. | 364/557 |
| 4,739,257 | 4/1988 | Jenson et al. | 324/158 F |
| 4,791,364 | 12/1988 | Kufis et al. | 324/158 F |
| 4,848,090 | 7/1989 | Peters | 62/3.3 |
| 4,962,355 | 10/1990 | Holderfield et al. | 324/158 F |
| 4,982,153 | 1/1991 | Collins et al. | 324/158 F |
| 5,126,656 | 6/1992 | Jones | 324/158 F |
| 5,166,607 | 11/1992 | Long | 324/158 F |
| 5,172,049 | 12/1992 | Kiyokawa et al. | 324/158 F |
| 5,283,854 | 2/1994 | Schiebelhuth | 392/467 |
| 5,360,348 | 11/1994 | Johnson | 439/72 |
| 5,373,893 | 12/1994 | Eisenmann et al. | 165/65 |
| 5,523,678 | 6/1996 | Mitsui | 324/158.1 |
| 5,528,159 | 6/1996 | Charlton et al. | 324/758 |

FOREIGN PATENT DOCUMENTS 41 04 098 A1  8/1991  Germany.

*Primary Examiner*—Mark Paschall
*Attorney, Agent, or Firm*—Edmund J. Walsh

[57] ABSTRACT

A semiconductor device handler with a temperature controlled test area. Temperature control is provided in part through the use of temperature controlled air forced across the test area. For heating the test area, electrical resistance heaters are uniformly distributed through the test area and are controlled to provide the desired temperature. The handler has a close pitch between adjacent sockets such that is not possible to distribute refrigeration elements over the test area. Instead, a refrigeration element is placed on one side of the test area. To prevent formation of an undesirable temperature gradient, heat is injected at a specific location in the test area.

18 Claims, 9 Drawing Sheets

SECTION A-A

METHOD AND APPARATUS FOR TEMPERATURE CONTROL OF A SEMICONDUCTOR ELECTRICAL-TEST CONTRACTOR ASSEMBLY

This invention relates generally to the manufacture of semiconductor devices and more specifically to electrical test of semiconductor devices at controlled temperatures.

As part of their manufacture, semiconductor devices, or "chips," are tested to verify that they operate over a range of temperatures. In general, the chips are presented to a semiconductor test system by a device called a "handler". The handler plugs the chips into sockets, or "contactors," that are connected to the test head of the test system. Once the chips are tested, they are removed from the sockets and passed on for sorting or other processing based on the results of the electrical test.

Chips are often tested at various temperatures in the range between –60° C. to 160° C. To enable testing in this temperature range, a handler generally includes some mechanism to heat or cool the chips before they are plunged into the sockets that connect to the test head. This operation is called "thermal conditioning" or "soaking." Soaking is done in an oven-like chamber for elevated temperature testing or in a freezer-like chamber for reduced temperature testing.

FIG. 1 illustrates a prior art test set up. Handler 1 presents chips to a test head 4a that is connected to a tester 2 through cable 3. Test head 4a is supported by manipulator 4b.

Tubes of chips (not shown) are inserted into handler 1 at top 5, which serves as the input area. The chips are routed to a test area 6 where they are plunged into sockets (not shown) connected to test head 4a. After testing, the chips are removed from the sockets and pass to sort area 7. In sort area 7, the good chips are sorted into groups of chips with similar performance characteristics. For example, chips that do not function properly at any temperature are sorted into one group and are likely discarded. Chips that operate across the full temperature range are likely to be sorted into a separate group. Chips that function properly only over a reduced temperature range are likely to be sorted into a separate group. A chip manufacturer will sort the chips based on performance in this fashion so that chips with higher performance can be sold at a higher price.

FIG. 2 shows handler 1 pulled apart from test head 4a. Back wall 10a is shown with an electrical contact assembly 8 mounted on it. Handler interface board 9 connects, on one face, to contact assembly 8. The other face of handler interface board 9 makes contact to test head 4a.

Contact assembly 8 is illustrated as an array of electrical contact elements. Typically, there will be between 1 and 32 contactors in the array such that multiple chips might be tested simultaneously.

Various different types of equipment might be used in a test system. For example, handler 1 is illustrated as a gravity feed handler. The chips pass through the handler, from top to bottom, largely because of the pull of gravity. Tray type handlers are also used. In a tray type handler, the chips are placed on a tray, which is moved through the handler by belts or robotic arms.

Variations also exist in the test system. It is not, for example, necessary that the test head be separate from the tester. Some test systems exist in which all of the electronic circuitry for testing is packaged in a test head. A test head is used, though, because transmission of electrical signals over wires or cables of any significant distance can distort those signals and make testing inaccurate. Therefore, at least some portion of the electronics, which generates or receives the test signals, are located in a test head, which is placed physically as close as possible to the handler.

However, having a test head so close to the handler is a problem for accurate temperature control of the chips. The test head represents a large thermal mass. Often, the test head is cooled to maintain a constant temperature inside the test head during a test. A constant temperature is important to ensure that the test and measurement electronics inside the test head operate accurately.

The test head is around 35° C. when it is operating. Because the test head is so close to the sockets in the handler, it will act as a heat sink if test area 6 is heated or will source heat into the sockets if test area 6 is cooled for low temperature testing. Though test area 6 is thermally sealed, the amount of thermal insulation between the test head and the socket is very limited. Increasing the amount of thermal insulation increases the physical separation between the contactor and the test head, which increases the signal distortion, particularly for high frequency test signals. As a result, heat flow between the socket and the test head results in a temperature difference between the air within test area 6 and the sockets that, depending on test temperature, could be about 10° C. When hot chips are plunged into the sockets, the temperature of the chips drops. Conversely, when cold chips are plunged into the sockets, their temperature tends to rise.

Changes in temperature of the chips are undesirable because the performance of the chips is affected by temperature. For accurate testing, the temperature of the chips must be controlled. It is desirable that the temperature of the chips not fluctuate more than 1° C. from the specified temperature.

One way that temperature has been controlled is through the use of forced air. A test chamber is formed between front wall 10b and back wall 10a of handler 1. Heated or cooled air can be blown over the chips while they are in the test chamber to reduce any temperature changes that result when the chips are plunged into the sockets. However, use of forced air as a way to control the temperature of chips during testing has several drawbacks.

One problem with the use of forced air is that accurate temperature control, particularly across a large array of chips, is difficult. The temperature of the air might drop as the air flows across chips. If an array of chips is tested simultaneously, the chips closer to the air inlet will be hotter than those further away from it. Thus, air flow is not well suited for temperature control in handlers that operate on large arrays of chips. In addition, because of the large amount of heat that is exchanged between the chips and the test head via heat flow through the contactors, the air would have to be very hot or very cold. As more contactors are added to the array, more heat is exchanged and the required temperature becomes even more extreme, which poses practical problems in machine design. Yet a further problem with temperature control using forced air flow is that the amount of heating or cooling required to ensure the chips are at the desired temperature can be different for different batches of parts inserted into the array of contactors.

Fluids, other than air, can be used for adding or removing heat to the chips. For example, chilled water has often been used for cooling, such as by routing the chilled water through the devices that push the chips into the sockets. However, there are additional difficulties in using other fluids. One additional difficulty is that a supply of these liquids must be provided. For example, using chilled water requires support equipment that is separate from the handler, which can be undesirable in a semiconductor manufacturing facility because of the cost and room taken up by that equipment. Additionally, care must be taken to ensure that the piping used to carry the fluid does not leak. The seals and other items needed to prevent leaks can take up additional space, making it difficult to provide cooling for arrays of many chips.

Examples of prior art handlers in which the temperature of chips is controlled by air, or other fluid, flow are found in U.S. Pat. No. 5,360,348 to Johnson and U.S. Pat. No. 4,962,355 to Holderfield et al., U.S. Pat. No. 4,787,752 to Fraser et al., U.S. Pat. No. 4,739,257 to Jenson et al. and U.S. Pat. No. 4,734,872 to Eager et al.

A second approach to temperature control is to have resistive heating elements or other sources of heat that are placed in thermal contact with the chips being tested or with the sockets that hold the chips. In some instances, these heating elements can also be connected in a feedback loop with a temperature sensor so that the temperature is more accurately controlled for each chip. Examples of such devices can be found in U.S. Pat. No. 5,528,159 to Charlton et al., U.S. Pat. No. 5,523,678 to Mitsui, U.S. Pat. No. 5,172,049 to Kiyokawa et al., U.S. Pat. No. 5,166,607 to Long, U.S. Pat. No. 4,604,572 to Horiuchi et al. and U.S. Pat. No. 4,379,011 to Suzuki et al.

Similar approaches might be used for controlling the temperature of chips for low temperature testing or both high and low temperature testing. However, there are many few examples of such uses. U.S. Pat. No. 4,848,090 to Peters is one example.

However, there are certain disadvantages to these approaches, particularly for use in conjunction with handlers that plunge an array of chips simultaneously. In some instances, the heating or cooling elements were not positioned close enough to each socket to give the required temperature control. As the arrays of contactors get larger, there might be significant variation in the temperature of the individual sockets.

Better temperature uniformity might be achieved by having one temperature control element per socket. However, merely duplicating the heating or cooling element for each socket presents a different set of problems. The cost of these elements, including sensors and control mechanisms can become significant for large arrays. In addition, the heating elements and associated sensors require space in the array of sockets. It often would be expensive or impractical to fit the required heating and cooling elements in the available space between sockets.

Therefore, there is a nee d for a low cost, compact and accurate way to control temperature of chips in a handler, particularly if an array of chips is tested simultaneously. There is also a need for a semiconductor handler that can be used for accurate temperature control for either high temperature or low temperature testing or both high and low temperature testing.

SUMMARY OF THE INVENTION

With the foregoing background in mind, it is an object of the invention to provide a handler that can accurately control the temperature of chips presented for testing.

It is also an object to provide a handler that can present chips for testing at both high temperature and low temperature.

The foregoing and other objects are achieved in a handler having a test area over which temperature conditioned air flows, impinging from a first side. Within the test area, test sockets are connected to a thermally conductive plate with a first heating or cooling element at a second side. A second heating or cooling element is mounted at an intermediate section of the conductive plate. The first and second heating or cooling elements are oppositely controlled such that one sources heat into the plate when the other sinks heat from the plate.

In a preferred embodiment, the air is cooled and the first heating or cooling element is a cooling element that removes heat from the conductive plate.

In the preferred embodiment, two temperature sensors are mounted on the conductive plate, one is mounted near the air inlet side of the array of test sockets and the other is mounted on the opposite side of the array of test sockets.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
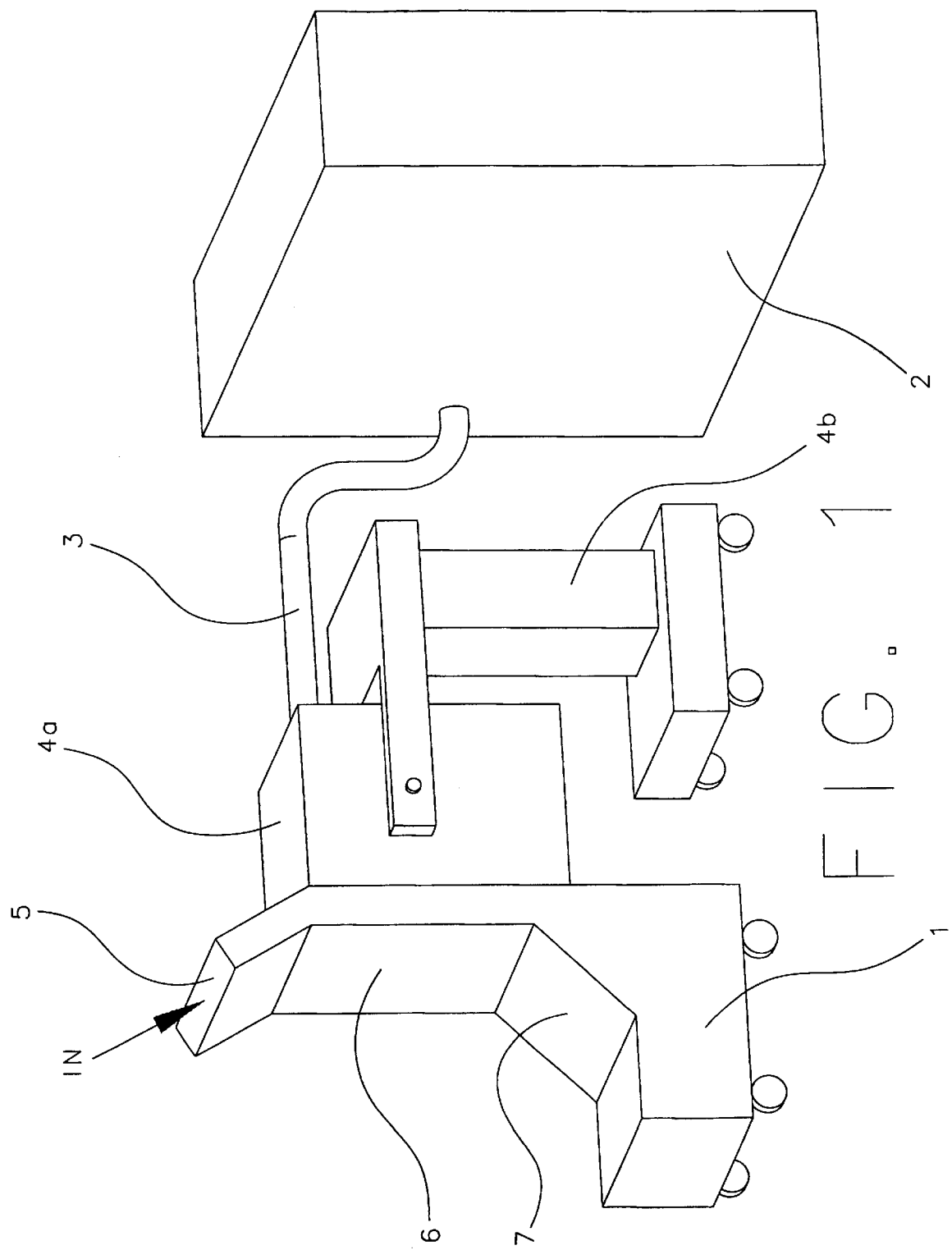
FIG. 1 is a view of a test system with a handler as in the prior art.
Figure 2:
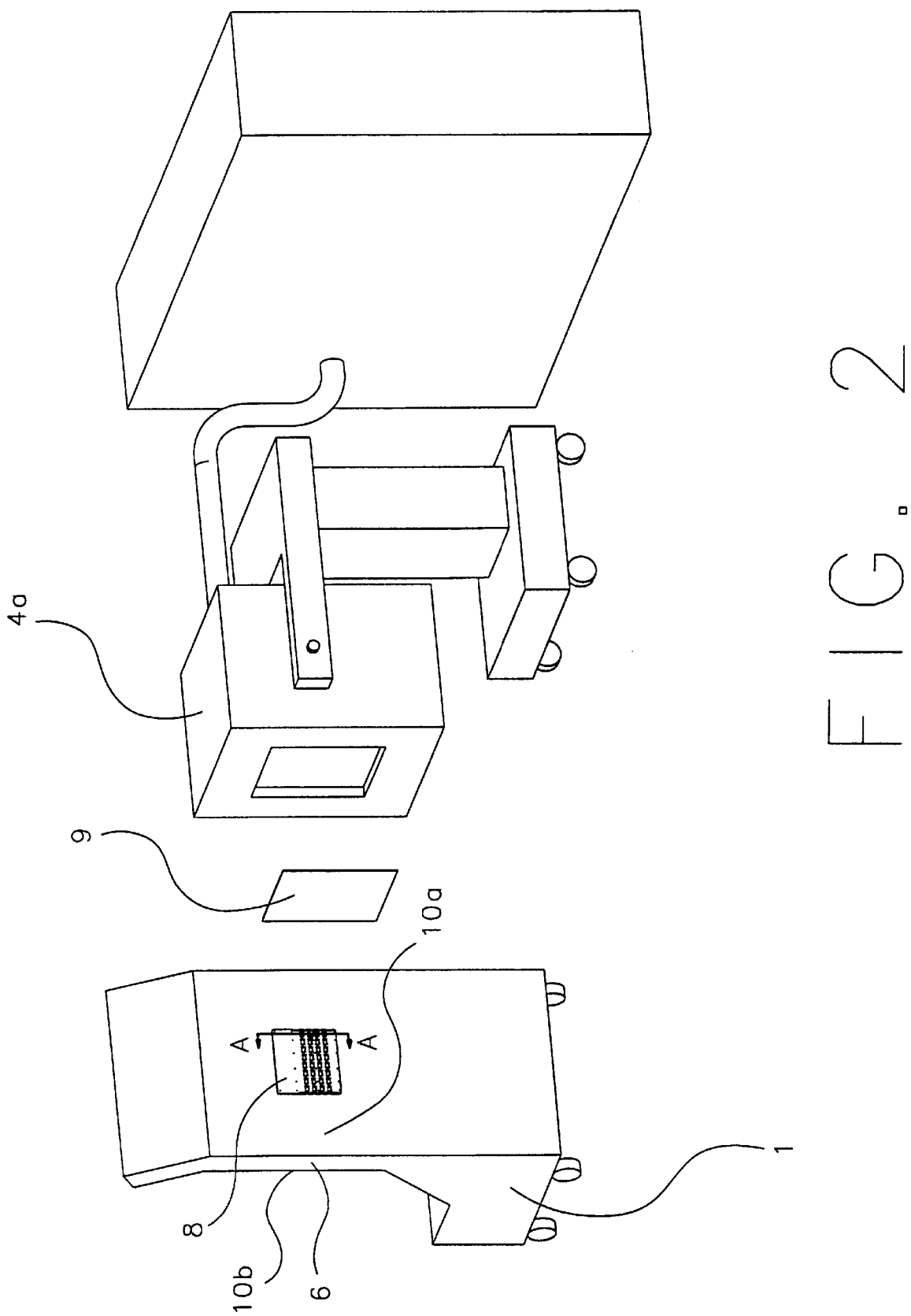
FIG. 2 is a view of the test system of FIG. 1, partially exploded.
Figure 3:
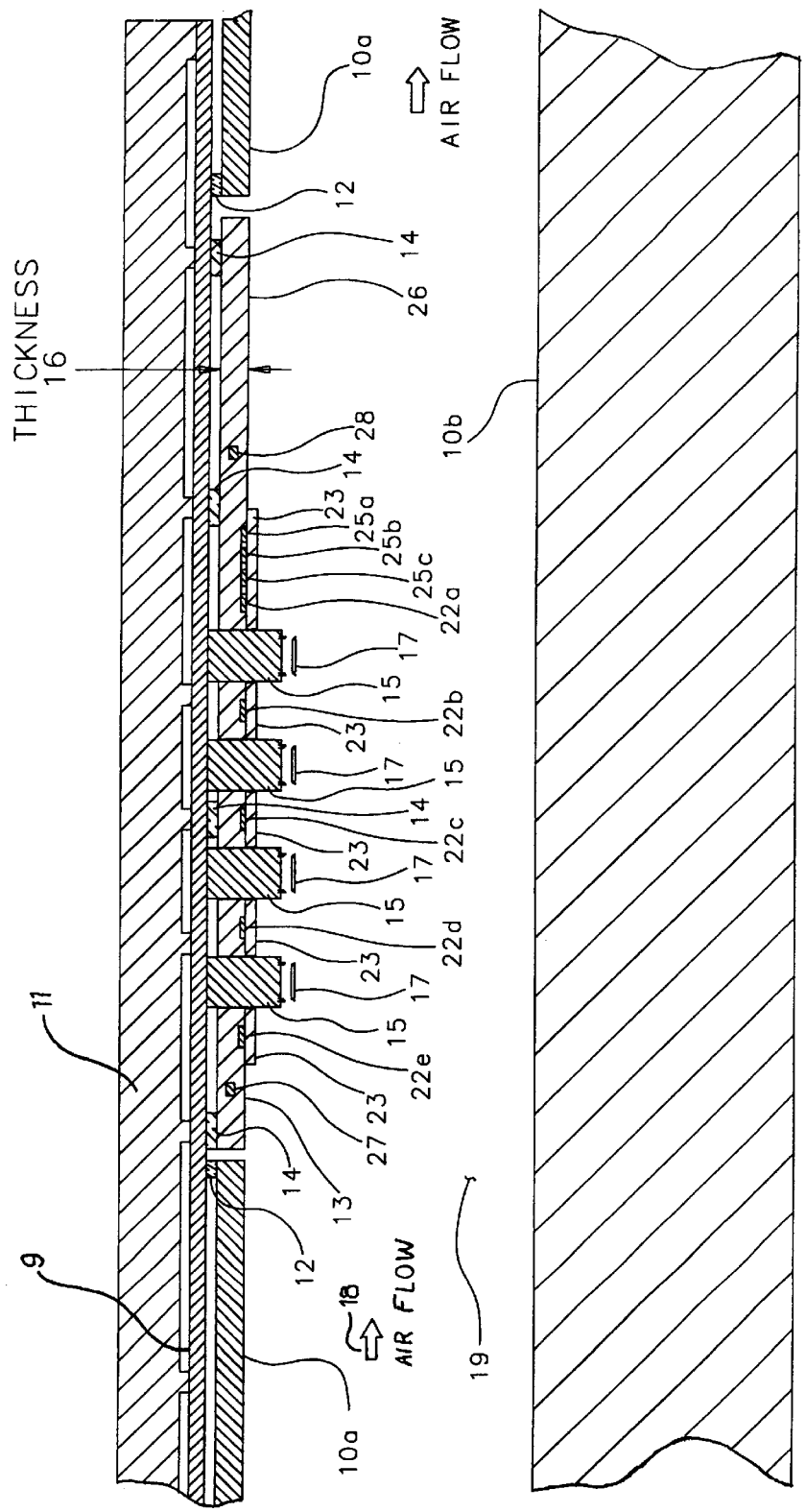
FIG. 3 is a cross sectional view through the handler of FIG. 2 along the line A—A, showing features of the invention.

FIG. 3 shows a cross section of test area 6 of a handler in FIG. 2. The cross section is taken along the line A—A illustrated in FIG. 2. The walls 10a and 10b of handler 1 define plenum 19, through which temperature controlled air is forced. Apparatus for generating a temperature controlled air flow is shown as blower 91 (FIG. 9), which is as known in the art. Preferably, blower 91 can generate hot or cold air at a controlled temperature in a range that includes all temperatures at which tests are to be conducted. Also, it is desirable that both the temperature and flow rate be uniform across width 29 (see FIG. 4) of the test area 8.

Retention plate 13 is attached to a handler interface board 9 in any convenient means, such as screws (not shown) at points 14. Mechanical support is provided to handler interface board 9 via stiffener 11, which is as in the prior art.

Retention plate 13 sets into an opening in wall 10a. Seal 12 forms a gasket around the opening in wall 10a into which retention plate 13 fits. A silicone seal can be used for this purpose, though other high temperature materials can be used to form the seal.

Retention plate 13 is made from thermally conductive material. In a preferred embodiment, aluminum is used.

Retention plate 13 is shaped to have a Biot number that is preferably much less than 1.0 based on the anticipated air flow velocity within plenum 19. The Biot number is the ratio of conductive thermal resistance to convective heat transfer resistance. The Biot number, as considered here, is the thickness 16, multiplied by the heat transfer coefficient on the exposed side of plate 13, divided by the thermal conductivity of the plate. Design to a Biot number much less than 1.0 reduces the temperature gradient across the plate and facilitates more uniform test temperatures for devices in handler 1. Preferably, the Biot number will be less than 0.01.

By way of example, in a preferred embodiment, the air flow velocity could be about 3 m/s and the plate could be made of aluminum 2.5 cm thick. Such a plate has a thermal conductivity of about $$165 \frac{W}{m \cdot \deg C}.$$

Assuming a heat transfer coefficient of $$20 \frac{W}{m^2 \deg C},$$

the Biot number is 0.003.

A plurality of sockets 15 are mechanically attached to retention plate 13. As used herein, "socket" refers to any device used to make electrical contact to the semiconductor chips 17 under test. In a handler, the sockets preferably allow chips 17 to be inserted and removed easily. The sockets should also make reliable electrical contact over a useful life that might include hundreds of thousands to millions of insertions. A preferred socket is a contactor sold by Kinetrix, Inc. of Bedford, N.H., USA. However, the specific type of socket is not critical to the invention.

Sockets 15 are attached to retention plate 13 in a manner that provides good thermal contact between retention plate 13 and sockets 15. Screws might be used for attachment. Preferably, sockets 15 fit into openings 40 (FIG. 4) in plate 15 with a very tight tolerance. However, other methods for ensuring good thermal contact are known in the art.

Sockets 15 make electrical contact with handler interface board 9. As in the prior art, handler interface board 9 routes the signals from sockets 15 to the test head 4a (FIG. 2). FIG. 3 shows a stiffener 11 backing handler interface board 9. Stiffener 11 provides mechanical support for handler interface board 9, as in the prior art.

An array of sockets 15 is included in handler 1. In cross section, a row of four sockets 15 is shown. In a preferred embodiment, four rows, each with eight sockets, are used. The number and positioning of the sockets is not critical to the invention. However, the invention will be most useful in a handler with numerous sockets, such as three or more in a row. The invention also will be most useful in conjunction with a handler having sockets positioned in a rectangular array of sockets, such that there are multiple rows, each having three or more sockets. Also, sockets 15 should preferably be positioned such that they are subjected to air flow 18.

The apparatus to position chips 17 into sockets 15 are not shown, as they are well known in the art. However, it will be appreciated that in a gravity feed handler chips 17 would be released from the input section 5 and drop into the test area, where they would be stopped next to the sockets. Plungers (not shown) that pass through wall 10b would then push the chips 17 into sockets 15 for testing. Following testing, the same plungers could remove chips from sockets 15, and drop them so that they would pass to sort area 7.

Temperature sensors 27 and 28 are incorporated into plate 13. Commercially available temperature sensors are well known. Temperature sensors 27 and 28 are attached to plate 13 to make good thermal contact. In a preferred embodiment, they are bonded or potted to plate 13. Temperature sensors 27 and 28 are electrically connected to a controller (90, FIG. 9). The controller can be a microprocessor or microcontroller or other similar device that has been programmed to control the temperature of the chips 17, as hereinafter described. In the preferred embodiment, a traditional PID control scheme is used to cycle heating or cooling elements off and on to achieve the desired temperature.

Also attached to plate 13 are a plurality of heating elements, 22a . . . 22e and 25a . . . 25c. Cover plate 23 holds the heating elements in place, but other known attachment mechanisms might be used.

Figure 4:
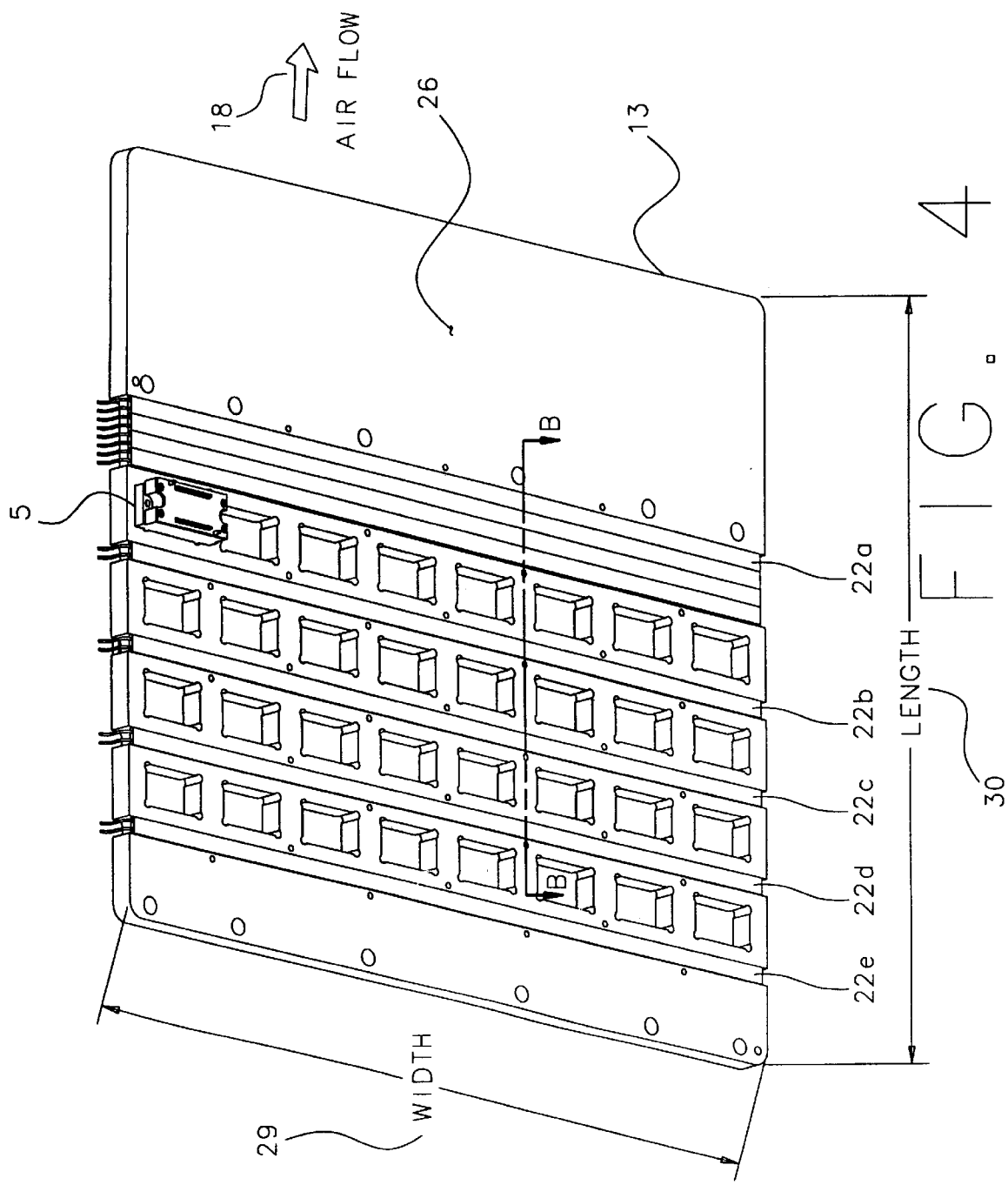
FIG. 4 is a view of the test area of a handler according to the invention.

As shown more clearly in FIG. 4, each of the heating elements is a strip that runs parallel with the columns of sockets 15 and orthogonal to the direction of air flow 18. Preferably, resistive heating strips, as known in the art, are used for the heating elements. Heating elements 22a . . . 22e and 25a . . . 25c are connected to the controller (90 FIG. 9) and are controlled, as hereafter described, to provide heating as required to maintain the desired temperature of the sockets 15.

Heating elements 22a . . . 22e are preferably evenly distributed around the sockets 15. It is desired that they provide even heating to all the sockets 15. In the illustrated embodiment, one of the heating elements is centered between each column of sockets 15. There is also one heating element next to the outside columns of sockets 15 in contact assembly 8 such that each socket is between two heating elements.

A heat sink 26 is also attached to plate 13. In terms of the direction of the air flow, indicated by arrows in FIG. 3, heat sink 26 is down stream from the sockets 15. Heat sink 26 might be any device that removes heat from plate 13. Examples of devices that might be used are thermoelectric devices, such as a heat pump, or refrigeration equipment or cooled liquid pumped through ducts. Preferably, the temperature of heat sink 26 is controlled, in a known fashion by the controller (not shown) for handler 1.

In a preferred embodiment, each of the heating elements 22a . . . 22e is of the same power rating. Also, all of the heating elements 22a . . . 22e are ganged for control. Thus, each provides the same amount of heat. For ease of manufacture, heating elements 25a. . . 25c are identical to heating elements 22a . . . 22e. Heating elements 25 . . . 25c are also ganged together for control, but are controlled independently of heating elements 22a . . . 22c.

As shown more clearly in FIG. 4, plate 13 has a width 29 and a length 30. An array of openings 40 are cut into plate 13. Sockets 15 are mounted in openings 40.

Figure 5:
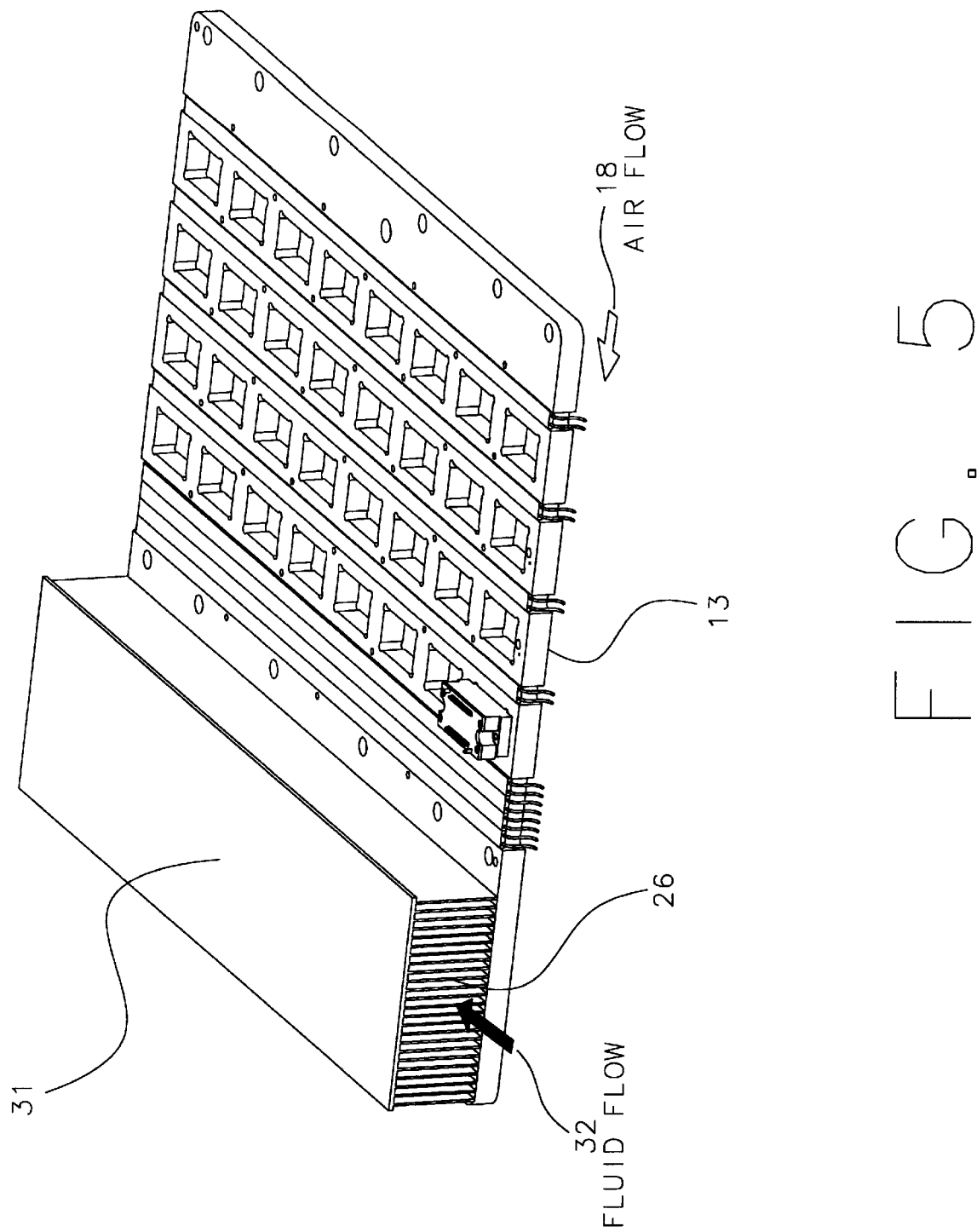
FIG. 5 is a view of an alternative embodiment of the test area of a handler according to the invention.

FIG. 5 shows plate 13 with a heat sink 31 attached to it. Heat sink 31 operates by a fluid flow 32 passing through it. Fluid flow 32 could represent an air flow that is controlled separate from air flow 18. Other fluids might be used, though.

Figure 6:
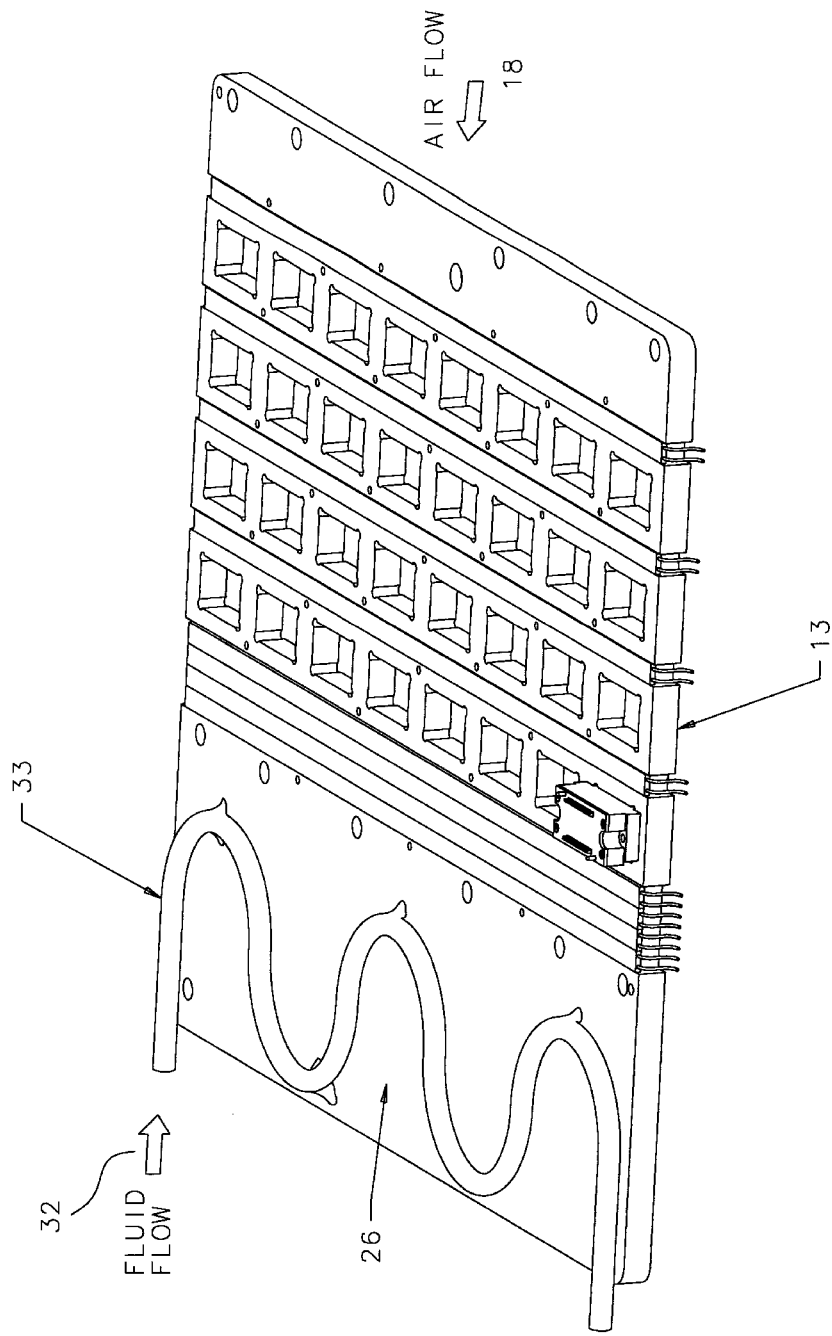
FIG. 6 is a view of an alternative embodiment of the test area of a handler according to the invention.

FIG. 6 shows an alternative implementation of heat sink 26. In FIG. 6, heat sink 26 is a duct 33 through which a fluid flows. In the embodiments of FIG. 5 and FIG. 6, the fluid within heat sink 26 is a chilled fluid.

Operation

Figure 9:
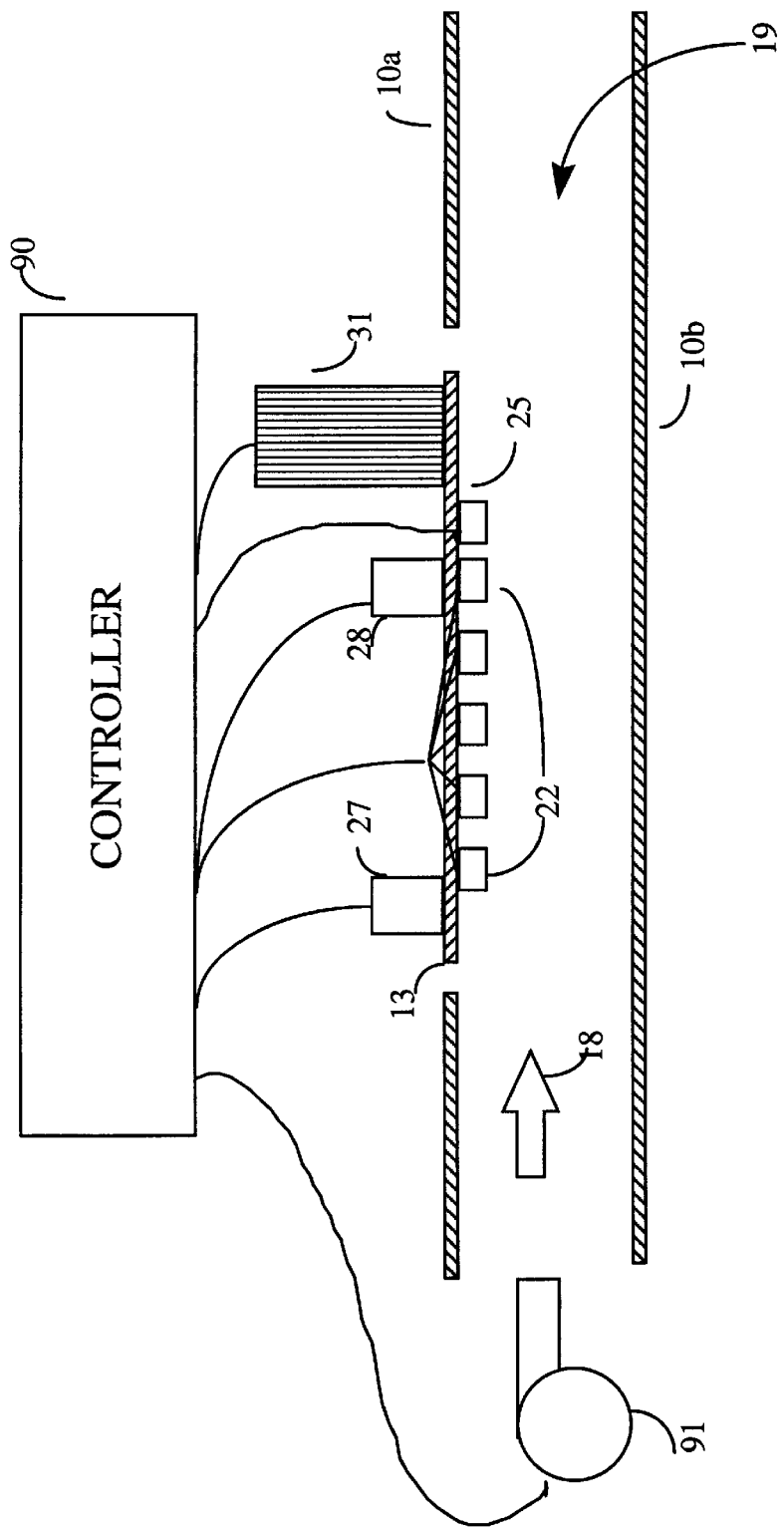
FIG. 9 shows a sketch of the temperature control structure according to the method of the invention.

A handler incorporating the invention may be operated to provide a uniform temperature at each of the sockets 15, to within +/−1° C., over a temperature range of −60° C. to +160° C. FIG. 9 provides a sketch useful in understanding control of temperature.

For testing at an elevated temperature, controller 90 activates heating elements 22a . . . 22e. One of the sensors 27 or 28 is used to sense the temperature of plate 13. The output of the selected sensor is provided to controller 90 which then cycles the heating elements 22 . . . 22e off and on, as appropriate to bring plate 13 to the desired temperature.

For testing at an elevated temperature, air flow 18 may optionally be used to provide a source of heat. For heating, air flow 18 represents a flow of heated air preferably at a temperature that equals the desired test temperature. Blower 91 can also be controlled by controller 90, which sets the heat of the air flow. If air flow 18 is used for testing at elevated temperatures, the required heat output of each of the heating elements 22a . . . 22e is reduced.

Heating elements 25a . . . 25c are not, in a preferred embodiment, active during testing at an elevated temperature. Likewise, because plate 13 should be at a constant temperature over the test region 8, only one of the sensors 27 or 28 is needed. The other sensor can be used to verify that the temperature of plate 13 is uniform, if desired.

For cooling, similar elements are used. However, the cost of having a cooling element adjacent each column of sockets 15 is avoided. As can be seen in FIG. 5 and FIG. 6, heat sink 26 is significantly larger than heating elements 22a . . . 22e. There would be significant cost of making a cooling element small enough to fit between each of the columns of sockets 15. Alternatively, the spacing of sockets 15 might have to be increased to an undesirable level to fit cooling elements between columns of sockets 15. As described below, precise temperature control is achieved without cooling elements between each column of sockets.

For cooling, air flow 18 is a flow of cold air. Preferably, controller 90 sets the temperature of air flow 18 as it impinges on plate 13 to be equal to or slightly colder than the desired test temperature. Heat sink 26 will be set at a temperature that is below the desired test temperature. However, the exact initial setting for temperature at heat sink 26 is not critical because it will be adjusted by controller 90.

Figure 7:
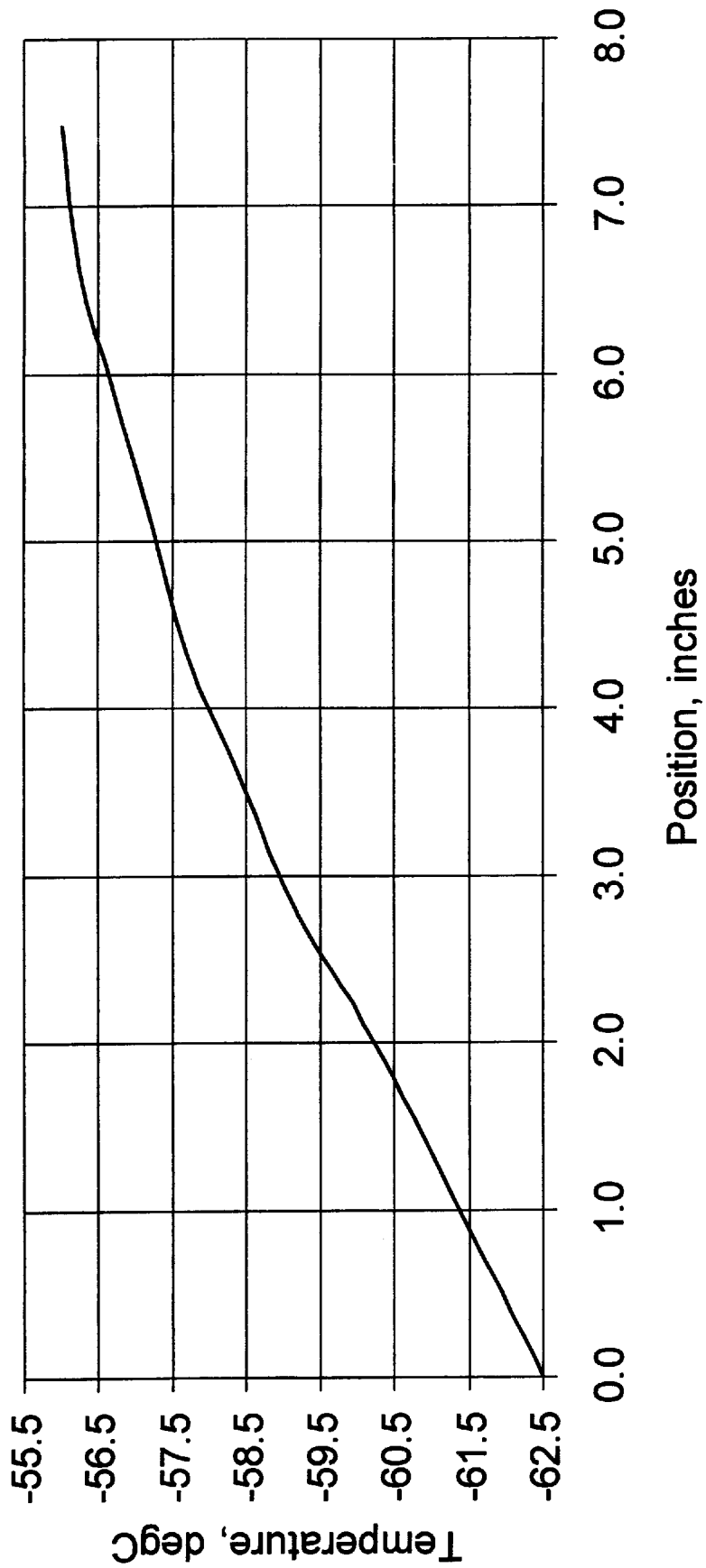
FIG. 7 is a graph showing temperature differences across the test area, which is useful in understanding the operation of the invention.

FIG. 7 illustrates the temperature distribution across plate 13 with air flow 18 being a cold air flow and heat sink 26 activated. The position in inches, shown as the horizontal axis of the graph in FIG. 7 measures distance from heat sink 26.

FIG. 7 illustrates that heat sink 26 reduces the average temperature of plate 13. However, there is a significant temperature gradient across test area 8. This gradient will translate directly in differences in test temperature of chips 17 within the same row of sockets 15.

Figure 8:
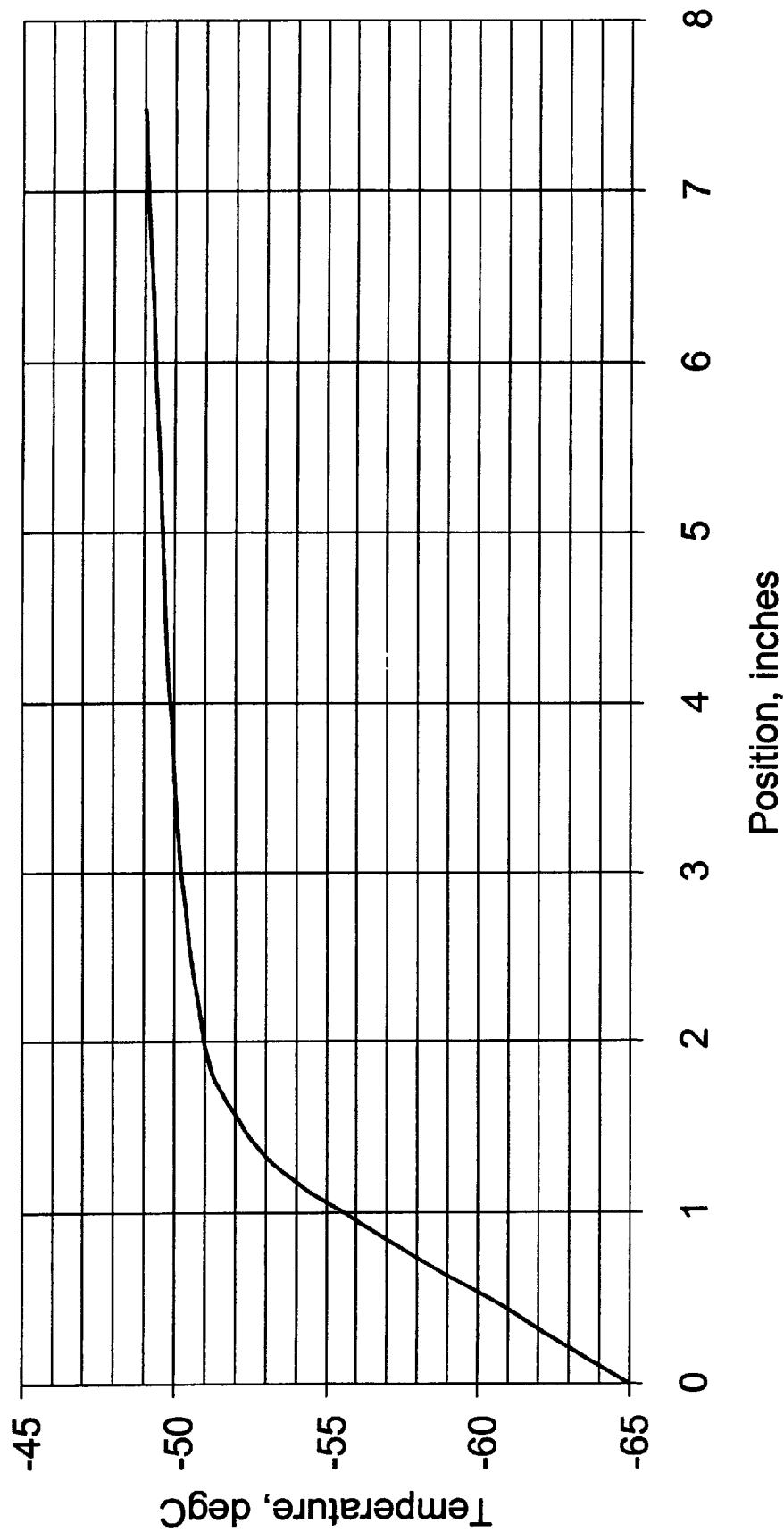
FIG. 8 is a graph showing temperature differences across the test area, which is useful in understanding the operation of the invention.

Heating elements 25a . . . 25c are used to significantly reduce the temperature gradient. By activating heating elements 25a . . . 25c to inject heat between the cold air inlet and heat sink 26, the temperature gradient can be significantly reduced. FIG. 8 shows the effect of activating heating elements 25a . . . 25c. As seen in FIG. 8, there is a substantial region over which the temperature deviates by less than +/−1° C. This region corresponds to test area 8.

To provide the required temperature gradient and required average temperature, either of temperature sensors 27 and 28, or both, are used by controller 90. If sensor 27 has a reading that is above its target temperature, controller 90 decreases the temperature of heat sink 26 or increase the heat injected by heating elements 25a . . . 25c. If sensor 28 has a reading that is below its target temperature, the heat injected by heating elements 25 . . . 25c is increased.

As described above, the temperature of the heating and cooling element is controlled by controller 90. In a preferred embodiment, the amount of heating or cooling provided by a particular element is increased or decreased by adjusting the on cycle time for that element. A PID control algorithm is used to maintain the temperature of heaters 22 and 25 and also of heat sink 26. However, many temperature control techniques are known and can be used.

Having described one embodiment, numerous alternative embodiments or variations might be made. For example, the number of rows or columns of sockets could be changed. Though the invention is most useful for large numbers of sockets, say more than 12, the specific number used is not important.

Additionally, the specific number of heating or cooling elements is not important. For example, three heating elements 25a . . . 25c are shown. Three heating elements are used in the preferred embodiment so that they all might be the same size as heating elements 22a . . . 22e. One larger heating element might be used in place of heating elements 25 . . . 25c. Also, it was described that all three heating elements 25a . . . 25c are ganged to be simultaneously turned on and off. However, the heating elements 25a . . . 25c could be controlled separately to provide finer resolution in temperature control.

In addition, it was shown that heating elements 25a . . . 25c used to control the temperature gradient for low temperature testing are separate from the heating elements 22a . . . 22e that are used for providing heat in high temperature testing. Heating element 22a might be used instead of the heating elements 25a . . .25c.

Also, it was described that cold air is used for providing a cold source at one end of plate 13. Other cold sources might be used. For example, a heat sink, like heat sink 26 might be placed at the opposite end of plate 13. Were a heat sink used instead of a source of cold air, a separate heater might be included for gradient control. Thus, each end of plate 13 would be symmetrical. In addition, cooling might be provided to each of the sockets 15. If the desired temperature could not be reached with these sources of cooling, a heat sink 26, with a heater for gradient control, might still be used.

Further, it was described that, when sensor 27 is too hot, the amount of cooling provided by heat sink 26 is increased, thereby lowering the average temperature of plate 13. Alternatively, if sensor 27 indicates the temperature of plate 13 is too high, the average temperature of plate 13 might be decreased by lowering the temperature of air flow 18.

In addition, it is described that control of the temperature gradient across plate 13 is used only when the plate is being cooled. A similar technique might be used when plate 13 is heated. For heating, though, the converse heating and cooling arrangements would be used. A source of heat would be provided at one end of the plate and a cold source would be provided in between that heat source and the center of the plate.

Also, it is described that sockets 15 are constructed on a plate. It is not necessary that the plate be a solid metal plate. Any material that is thermally conductive could serve as a plate. Likewise, individual pieces that are thermally connected could serve as a plate.

Further, it was described that only two temperature sensors are used. Additional temperature sensors might be used.

It was described that temperatures were assumed to be constant across the width of plate 13 and therefore the temperature gradient was controlled only across the length of plate 13. However, it would be possible to control the temperature gradient in each dimension, if necessary.

In addition, it was described that heating elements are laid out as strips that run parallel to a column containing multiple sockets. The same effect might be achieved by having individual heating elements associated with each socket. If individual heating elements are used, they could be next to or associate with each socket.

Further, it is not necessary that the temperature sensors 27 and 28 be completely outside the region of plate 13 to which sockets 15 are attached. It is desirable that the temperature sensors be widely separated to get a more accurate measurement of the temperature gradient across the plate. However, the temperature sensors might be placed anywhere with sufficient separation to measure a gradient.

Additionally, it should be noted that the temperature control is based on measurements of the temperature of the retention plate to which the contactors are attached. Thus, the temperature control serves to regulate the temperature of the contactors rather than the semiconductor devices being tested. It is likely that calibration will be used to determine the required temperature of the contactors to yield a desired temperature for the devices under test.

Therefore, the invention should be limited only by the spirit and scope of the appended claims.

What is claimed is:

1. Apparatus having a region that is desired to be maintained at a uniform temperature, comprising:
   a) a plate with the region disposed thereon, said plate having a first end and a second end;
   b) a first cold source thermally coupled to the plate;
   c) a second cold source thermally coupled to the plate between the region and the second end;
   d) at least one temperature sensor coupled to the plate; and
   e) a heat source thermally coupled to the plate between the region and the second cold source.

2. The apparatus of claim 1 wherein the first cold source comprises cold air flowing over the plate.

3. The apparatus of claim 2 wherein the plate has a thickness providing a Biot number less than 1.0.

4. The apparatus of claim 1 wherein the second cold source comprises a heat sink.

5. The apparatus of claim 1 wherein the heat source comprises at least one electrical resistance heater.

6. The apparatus of claim 1 wherein the first cold source comprises forced air impinging on the plate from the first end and the apparatus additionally comprises a second temperature sensor between the first end and the first temperature sensor.

7. A semiconductor handler incorporating the apparatus of claim 1 wherein the region comprises a test region having a plurality of test sockets attached to the plate.

8. The semiconductor handler of claim 7 wherein the test sockets are disposed in an array of rows and columns and additionally comprising a plurality of heating elements, each disposed between adjacent columns of sockets.

9. The semiconductor handler of claim 7 additionally comprising a means, responsive to the temperature sensor, for controlling the heat source, the means for controlling increasing the amount of heat generated by the heat source when the temperature sensor indicates a temperature below a target value.

10. The semiconductor handler of claim 9 additionally comprising:
   a) a second temperature sensor;
   b) means, responsive to the second temperature sensor, for decreasing the temperature of the second cold source when the temperature of the second temperature sensor is above a threshold.

11. The semiconductor handler of claim 7 additionally comprising:
   a) a plurality of elongated heating elements disposed between the sockets;
   b) a controller connected to the plurality of elongated heating elements, the first cold source, the second cold source and the temperature sensor.

12. A method of operating a temperature control system to provide a uniform temperature over a region of a thermally conductive plate, comprising the steps of:
   a) forcing temperature controlled fluid over the region, the fluid traveling in a first direction;
   b) setting the temperature at a first point on the plate outside the region;
   c) providing the ability to control the temperature at a second point on the plate, the first point being offset from the second point in the first direction;
   d) measuring the temperature of the plate at a third point and a fourth point, the fourth point being offset from the third point in the first direction; and
   e) controlling the average temperature and temperature uniformity in the region according to the steps of:
      i) when the temperature at the third point deviate s from a first target value, changing the temperature of the fluid or the temperature setting at the first point in a direction to bring the temperature at the third point closer to the target value; and
      ii) when the temperature at the fourth point deviates from a second target value, changing the temperature at the first point or the second point to bring the temperature at the fourth point closer to the second target value.

13. The method of claim 12 wherein the step of forcing temperature controlled fluid comprises forcing cooled air.

14. The method of claim 13 wherein the step of setting the temperature at a first point comprises cooling the first point.

15. The method of claim 14 wherein the step of providing the ability to control the temperature at a second point comprises providing a heating element at the second point.

16. A method of operating a temperature control system to provide a uniform temperature over a region of a thermally conductive plate, comprising the steps of:
   a) forcing a cooled fluid across the plate, the fluid flowing in a first direction;
   b) making measurements that allow a determination of the average temperature on the plate and the temperature gradient in the first direction;
   c) when the measurements indicate that the average temperature of the plate exceeds a predetermined value, increasing the cooling of the plate at a first point offset from the region in the first direction;
   d) when the measurements indicate that the temperature gradient exceeds a threshold, heating the plate at a second point, the first point being offset from the second point in the first direction.

17. A method of manufacturing semiconductor devices, comprising the steps of:
   a) inserting a plurality of semiconductor devices into sockets, each of which is attached to the region of the thermally conductive plate;
   b) testing the semiconductor devices while controlling the temperature of the plate according to the steps of claim 16; and
   c) sorting the semiconductor based on the results of the tests achieved in step b).

18. The method of manufacturing semiconductor devices of claim 17 additionally comprising the step of attaching the plate to the test head of a test system.

* * * * *